United States Patent
Mori

(10) Patent No.: US 9,293,492 B2
(45) Date of Patent: Mar. 22, 2016

(54) IMAGING APPARATUS

(71) Applicant: CANON KABUSHIKI KAISHA, Tokyo (JP)

(72) Inventor: Taisei Mori, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/737,786

(22) Filed: Jun. 12, 2015

(65) Prior Publication Data

US 2015/0372039 A1    Dec. 24, 2015

(30) Foreign Application Priority Data

Jun. 20, 2014   (JP) .................................. 2014-127250

(51) Int. Cl.
*H01L 29/00*     (2006.01)
*H01L 31/00*     (2006.01)
*H01L 27/146*    (2006.01)
*H01L 31/0232*   (2014.01)

(52) U.S. Cl.
CPC .... *H01L 27/14625* (2013.01); *H01L 27/14603* (2013.01); *H01L 31/02325* (2013.01)

(58) Field of Classification Search
CPC ................. H01L 27/14625; H01L 27/14603; H01L 27/14601; H01L 31/02325; H01L 31/0232; H01L 31/02024
See application file for complete search history.

(56) References Cited

U.S. PATENT DOCUMENTS

| | | | |
|---|---|---|---|
| 5,844,289 A | 12/1998 | Teranishi et al. | |
| 7,135,672 B2* | 11/2006 | Land ..................... | G01S 7/4811 250/208.6 |
| 8,735,829 B2 | 5/2014 | Kuwabara | |
| 2003/0019931 A1* | 1/2003 | Tsikos .................. | G02B 26/10 235/454 |
| 2003/0019932 A1* | 1/2003 | Tsikos .................. | G02B 26/10 235/454 |
| 2003/0019933 A1* | 1/2003 | Tsikos .................. | G02B 26/10 235/454 |

FOREIGN PATENT DOCUMENTS

| JP | H09-312385 A | 12/1997 |
|---|---|---|
| JP | H10-111427 A | 4/1998 |
| JP | 2000-316805 A | 11/2000 |
| JP | 2012-200455 A | 10/2012 |

* cited by examiner

*Primary Examiner* — Nikolay Yushin
(74) *Attorney, Agent, or Firm* — Fitzpatrick, Cella, Harper & Scinto

(57) ABSTRACT

An imaging apparatus includes an image sensor and an image fiber that guides light incident from a focusing optical system toward the image sensor. The image sensor has such configuration that the distance in a first direction between two intersections is between ¼ times and ¾ times a pixel pitch of the image sensor, where one intersection is an intersection between a straight line passing through the center of the first sensor pixel and parallel to the first direction and a straight line connecting the center of the target pixel and the center of the adjacent pixel and the other intersection is an intersection between a straight line passing through the center of the second sensor pixel and parallel to the first direction and a straight line connecting the center of the target pixel and the center of the adjacent pixel.

8 Claims, 12 Drawing Sheets

$1/2 \times P_s$ $1/4 \times P_s$ $3/4 \times P_s$

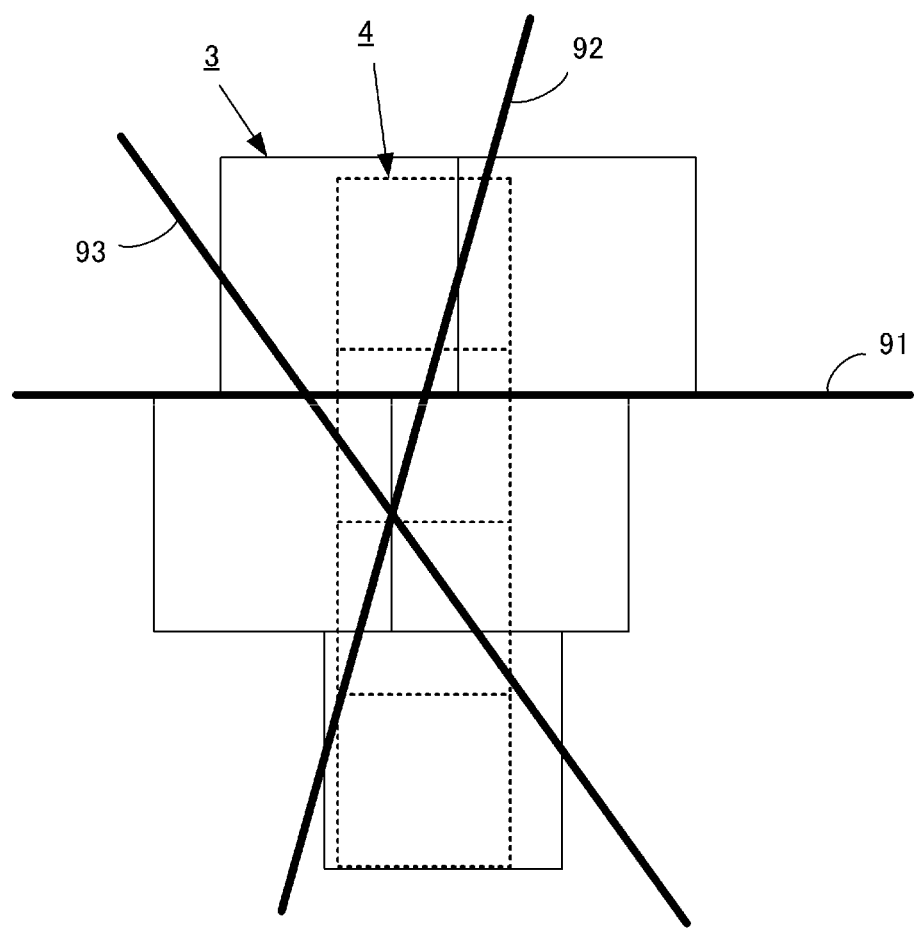

IMAGING APPARATUS

BACKGROUND OF THE INVENTION

1. Field of the Invention

The present invention relates to an imaging apparatus, and more particularly, to an imaging apparatus that transmits light to an electronic image sensor via an image fiber to capture images.

2. Description of the Related Art

Various imaging apparatuses employ a configuration in which light incident from an imaging optical system is transmitted through an image fiber and an electronic image sensor captures images. For example, apparatuses such as a fluorescent imaging apparatus, an industrial weak light detecting apparatus, or an astronomical observation apparatus use techniques for amplifying weak light with the aid of an image fiber to obtain high-brightness images.

A moire pattern occurs in an image captured by transmitting light incident from an imaging optical system to an electronic image sensor through an image fiber. Two causes can be thought of as the causes of the moire pattern. One of the causes is non-uniform sensitivity resulting from a difference between the types and cycles of the lattice of the electronic image sensor and the lattice of the image fiber. Japanese Patent Application Publication No. H9-312385 proposes a method of reducing a moire pattern resulting from the non-uniform sensitivity remarkably by employing a configuration in which the angle between the lattice of photoelectric transducers and the lattice of optical fibers is between 10° and 20°.

The other cause is the difference between the cycle of sensor pixels and the cycle of fiber pixels. A radiographic imaging apparatus disclosed in Japanese Patent Application Publication No. 2012-200455 proposes a configuration in which a scatter removing grid (corresponding to the image fiber) in which radiation absorbing materials are arranged in a grid form is inclined with respect to a radiation detector so as to satisfy a condition determined from the frequency of an imaging segment. By inclining the grid so as to satisfy the condition, it is possible to shift a moire pattern to a frequency region higher than the frequency of the imaging segment and to prevent the occurrence of the moire pattern.

SUMMARY OF THE INVENTION

In the technique disclosed in Japanese Patent Application Publication No. H9-312385, it is possible to suppress a moire pattern occurring due to non-uniform sensitivity resulting from a difference between the types and cycles of the lattice of the electronic image sensor and the lattice of the image fiber. However, a moire pattern occurring due to a difference between the cycle of sensor pixels and the cycle of fiber pixels remains.

Moreover, in the technique disclosed in Japanese Patent Application Publication No. 2012-200455, it is possible to prevent the occurrence of a moire pattern occurring due to the difference between the cycle of sensor pixels and the cycle of fiber pixels. However, it is necessary to change the range of inclinations of the radiation absorbing materials according to the frequency of a subject. Thus, it is difficult to apply this technique to an imaging apparatus that images a subject having various frequencies.

The present invention has been made in view of the above problems, and an object thereof is to provide an imaging apparatus that captures images via an image fiber so that a moire pattern occurring due to a difference between the cycle of sensor pixels and the cycle of fiber pixels is less noticeable.

In order to solve the problems, according to a first aspect of the present invention, there is provided an imaging apparatus including:

an image sensor in which a plurality of sensor pixels are arranged in a first direction and a second direction perpendicular to the first direction; and an image fiber which has an exit end surface facing the image sensor and guides light incident from a focusing optical system toward the image sensor and in which a plurality of fiber pixels are periodically arranged two-dimensionally, wherein when an optional pixel among the fiber pixels is defined as a target pixel, and when a fiber pixel which is adjacent to the target pixel and in which an inclination of a straight line that connects the center of the fiber pixel and the center of the target pixel is between 45° and 135° with respect to the first direction is defined as an adjacent pixel, and moreover when any one of sensor pixels that a straight line passing through the center of the target pixel and the center of the adjacent pixel crosses is defined as a first sensor pixel, and either one of two sensor pixels that are adjacent to the first sensor pixel in the second direction is defined as a second sensor pixel, a distance in the first direction between an intersection between a straight line that passes through the center of the first sensor pixel and is parallel to the first direction and the straight line that connects the center of the target pixel and the center of the adjacent pixel and an intersection between a straight line that passes through the center of the second sensor pixel and is parallel to the first direction and the straight line that connects the center of the target pixel and the center of the adjacent pixel is between ¼ times and ¾ times a pixel pitch of the image sensor.

According to a second aspect of the present invention, there is provided an imaging apparatus including:

an image sensor in which a plurality of sensor pixels are arranged in a first direction and a second direction perpendicular to the first direction; and an image fiber which has an exit end surface facing the image sensor and guides light incident from a focusing optical system toward the image sensor and in which a plurality of fiber pixels are periodically arranged two-dimensionally, wherein when an optional pixel among the fiber pixels is defined as a target pixel, and when a fiber pixel which is adjacent to the target pixel and in which an inclination of a straight line that connects the center of the fiber pixel and the center of the target pixel is between 45° and 135° with respect to the first direction is defined as an adjacent pixel, and when an angle between a straight line, which connects the center of the target pixel and the center of the adjacent pixel, and the first direction is defined as $\theta$, and when a pixel pitch in the first direction of the image sensor is defined as $P_s$, and moreover when a pixel pitch of the image fiber along the straight line that connects the center of the target pixel and the center of the adjacent pixel is defined as $P_f$, the following inequality is satisfied:

$$\tfrac{1}{4} \times P_s \le P_f \times \sin\theta \le \tfrac{3}{4} \times P_s.$$

According to the imaging apparatus of the present invention, a moire pattern occurring due to a difference between the cycle of the sensor pixels and the cycle of the fiber pixels can be made less noticeable.

Further features of the present invention will become apparent from the following description of exemplary embodiments with reference to the attached drawings.

BRIEF DESCRIPTION OF THE DRAWINGS

FIG. 9 is a diagram for describing the direction of a fiber pixel boundary which has a great influence on the occurrence of a moire pattern;

DESCRIPTION OF THE EMBODIMENTS

Embodiments of an imaging apparatus according to the present invention will be described with reference to FIGS. 1A and 1B to FIGS. 12A and 12B.

Embodiment 1

Basic Configuration

Figure 1A:
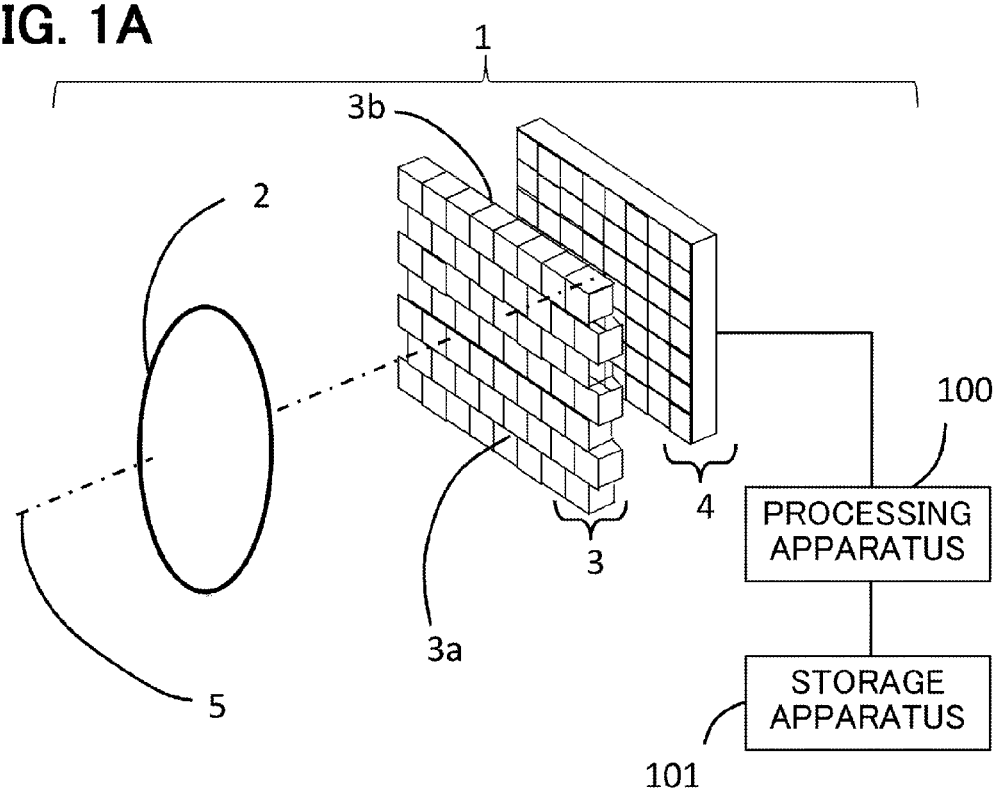
FIGS. 1A and 1B are diagrams illustrating a configuration of an imaging apparatus according to Embodiment 1.
Figure 1B:
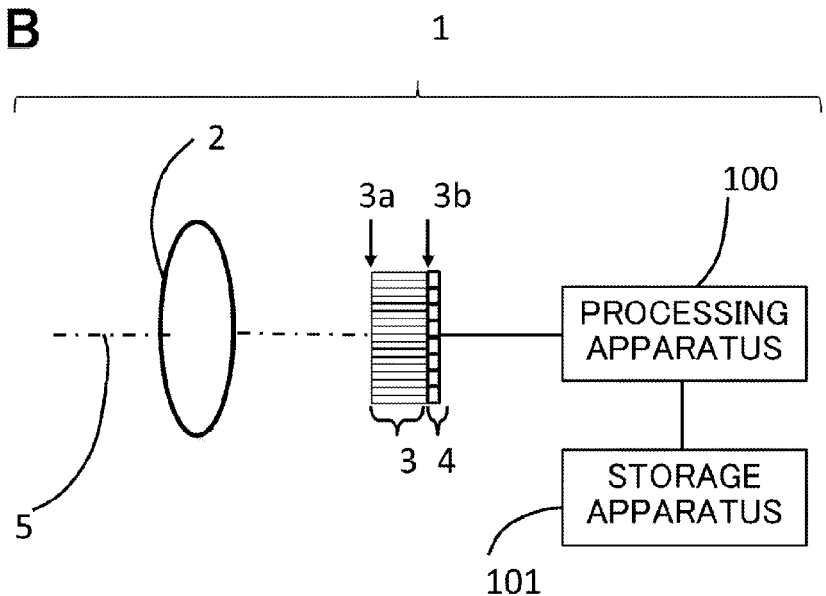

FIG. 1A illustrates a perspective view of an imaging apparatus 1 according to the present embodiment and FIG. 1B illustrates a cross-sectional view.

The imaging apparatus 1 includes a focusing optical system 2, an image fiber bundle 3, an electronic image sensor 4, a processing apparatus 100, and a storage apparatus 101. The image fiber bundle 3 and the electronic image sensor 4 are disposed perpendicularly to an optical axis 5 of the focusing optical system 2. An end surface of the image fiber bundle 3 close to the focusing optical system 2 is referred to as an incident end surface 3a and an end surface close to the electronic image sensor 4 will be referred to as an exit end surface 3b. The incident end surface 3a is an image plane of the focusing optical system 2 and the focusing optical system 2 focuses a subject image on the incident end surface 3a. The exit end surface 3b is disposed to face the electronic image sensor 4.

The image fiber bundle 3 is a two-dimensional arrangement of a plurality of fibers. One fiber includes a core glass, a cladding glass, and an absorber glass disposed in that order from the inner side. The cross-section of the fiber may be rectangular or circular. The image fiber bundle 3 is a cyclic arrangement obtained by binding a plurality of fibers. In the following description, the respective image fibers will be referred to as fiber pixels (image fiber pixels).

The electronic image sensor 4 has a structure in which a plurality of photoelectric transducers are arranged in a square lattice form. In the following description, the respective photoelectric transducer pixels of the electronic image sensor 4 will be referred to as sensor pixels (image sensor pixels). Moreover, arrangement directions of the electronic image sensor 4 will be referred to as horizontal and vertical directions.

The focusing optical system 2 focuses a subject beam on the incident end surface 3a of the image fiber bundle 3 to form an image. This image is received by the electronic image sensor 4 via the image fiber bundle 3 and is captured as image data. The image data captured by the electronic image sensor 4 is subjected to predetermined image processing in the processing apparatus 100 and the processed image data is stored in the storage apparatus 101.

<Cause of Moire Pattern>

A moire pattern does not appear in a captured image if the size of a fiber pixel is sufficiently smaller than the size of a sensor pixel. However, a moire pattern appears in a captured image if a fiber pixel has a considerable size as compared to a sensor pixel. The causes of a moire pattern will be described. In the following description, it is assumed that the fiber pixel size (or fiber pixel pitch) is approximately the same (for example, 0.8 times or more and 1.2 times or smaller than) as, but is not exactly the same as the sensor pixel size (or sensor pixel pitch).

Figure 2:
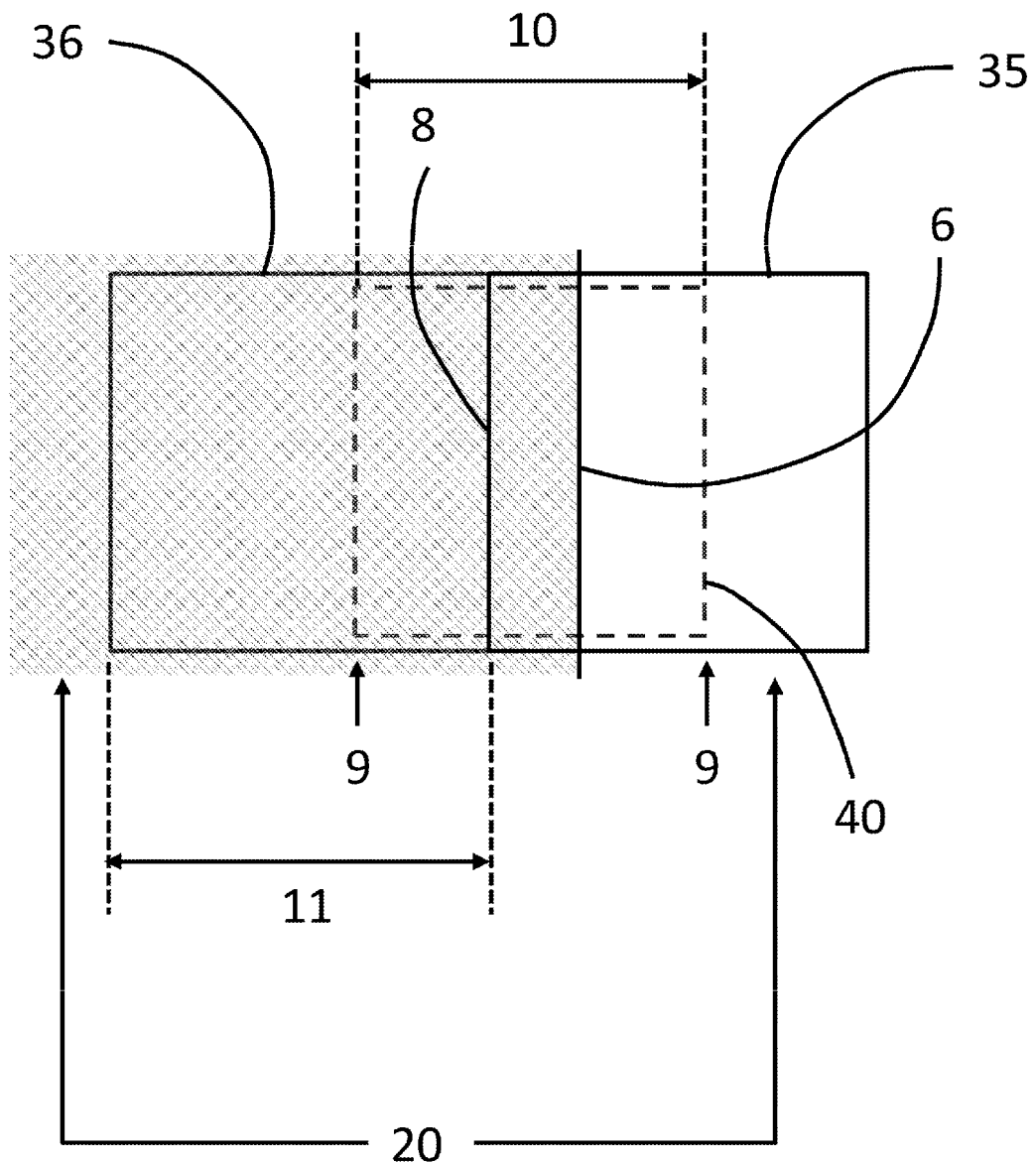
FIG. 2 is a diagram illustrating a positional relation among a sensor pixel, a fiber pixel, and a vertical stripe chart.

FIG. 2 illustrates one pixel of the electronic image sensor 4. In the drawing, a sensor pixel 40 of the electronic image sensor 4 is depicted by dotted lines. Moreover, two fiber pixels 35 and 36 on the electronic image sensor 3b of the image fiber bundle 3 are depicted by solid lines. Further, a vertical stripe rectangular chart image 20 formed on the image fiber bundle 3 is depicted in a hatched and outlined manner.

As illustrated in the drawing, the sensor pixel 40 overlaps two fiber pixels 35 and 36. A boundary (fiber pixel boundary) 8 between the fiber pixels 35 and 36 is positioned inside the sensor pixel 40. Moreover, the sensor pixel 40 overlaps both black and white portions of the vertical stripe rectangular chart image 20. A boundary (vertical stripe rectangular chart boundary) 6 between the black and white portions of the vertical stripe rectangular chart is positioned inside the sensor pixel 40. Moreover, the vertical stripe rectangular chart boundary 6 is also positioned inside the fiber pixel 36.

When the sensor pixel 40, the fiber pixels 35 and 36, and the vertical stripe rectangular chart image 20 are in such a positional relation illustrated in FIG. 2, black and white colors of the vertical stripe rectangular chart image 20 are mixed on the fiber pixel 35. Moreover, a gray image is output from the exit end surface of the fiber pixel 35. As a result, the image on the exit end surface becomes different from the image on the incident end surface, and an error occurs in a pixel value that the sensor pixel 40 acquires as compared to when the image fiber bundle 3 is not present. Although an error may occur or not depending on a subject actually, the magnitude (the largest value) of an error that can occur changes with a horizontal position of the fiber pixel boundary 8. For example, when the fiber pixel boundary 8 matches a sensor pixel boundary 9, the error is substantially zero regardless of a subject. On the other hand, when the fiber pixel boundary 8 is positioned at the center in the horizontal direction of the sensor pixel 40, the error may increase.

Due to a difference between horizontal components of a sensor pixel pitch 10 and a fiber pixel pitch 11, a horizontal position of the fiber pixel boundary 8 in sensor pixels arranged in the horizontal direction changes gradually. The position of the fiber pixel boundary 8 in sensor pixels changes periodically in the horizontal direction with the cycle of the least common multiple of the sensor pixel pitch 10 and the fiber pixel pitch 11. If the horizontal position of the fiber pixel boundary 8 is substantially the same for the sensor pixels 40 arranged in the vertical direction, since an error of the same magnitude appears successively in a captured image in the vertical direction, such an error is recognized as a vertical line. As described above, since the positional relation between the sensor pixel 40 and the fiber pixel boundary 8 changes periodically in the horizontal direction, a large error appears periodically in the horizontal direction. Thus, vertical lines based on an error are arranged periodically in the horizontal direction and a vertical stripe moire pattern appears. This is a moire pattern occurring due to a difference between the cycle of the electronic image sensor 4 and the cycle of the image fiber bundle 3, and the present embodiment aims to reduce this moire pattern.

In the following description, a region which is made up of sensor pixels arranged successively in the vertical direction and in which a large error is likely to occur in a pixel value will be referred to as a large-error region. Whether a certain sensor pixel belongs to the large-error region is determined based on whether a fiber pixel overlaps a sensor pixel. Moreover, whether a fiber pixel overlaps a sensor pixel is determined based on the position of the fiber pixel boundary 8 in relation to a sensor pixel.

Figure 3:
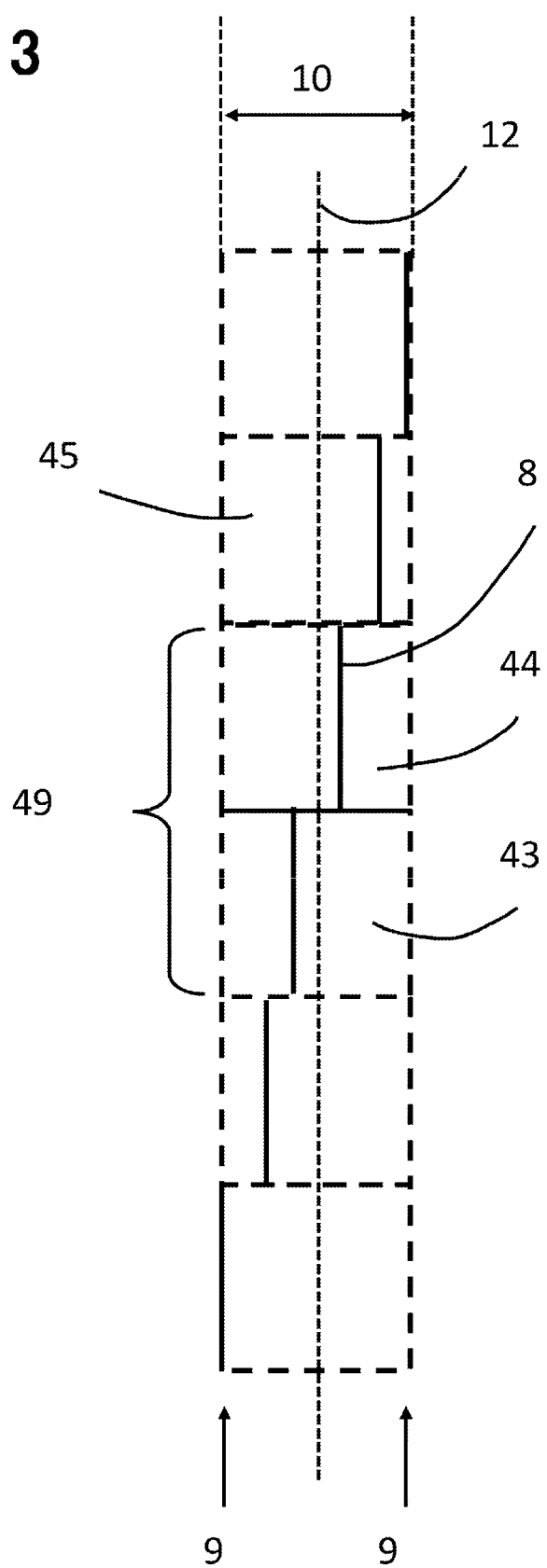
FIG. 3 is a diagram for describing the causes of a moire pattern.

FIG. 3 illustrates an example of a positional relation between an electronic image sensor and a fiber pixel boundary. In FIG. 3, pixels 43, 44, and 45 are arranged in that order in the vertical direction. Moreover, the fiber pixel boundary 8 is shifted in the horizontal direction by ⅕ times the sensor pixel pitch 10 between pixels adjacent in the vertical direction. It is to be noted that FIG. 3 is provided to describe the causes of a moire pattern and a large-error region and is not provided to illustrate the configuration of the electronic image sensor 4 and the image fiber bundle 3 of the present embodiment.

As described above, a large-error region 49 is a region of sensor pixels in which a large error value is likely to appear successively. The position of the large-error region 49 is determined based on a positional relation of the fiber pixel boundary 8 in relation to a sensor pixel center position 12. The closer the fiber pixel boundary 8 to the sensor pixel center position 12, the larger the error. Conversely, the farther the fiber pixel boundary 8 from the sensor pixel center position 12, the smaller the error. The large-error region 49 may be a region of successive pixels in which the fiber pixel boundary 8 is positioned close to the sensor pixel center position 12. That is, the large-error region 49 may be a region of successive pixels in which the distance between the fiber pixel boundary 8 and the sensor pixel center position 12 is small. If an average of the errors of two successive pixels is large, the two successive pixels belong to the large-error region 49. Conversely, if an average of the errors is small, the two successive pixels do not belong to the large-error region 49. That is, when an average of the errors of two successive pixels is equal to or larger than a predetermined threshold, it can be determined that the two pixels belong to the large-error region 49.

An error in the pixel value based on a difference between the sensor pixel position and the fiber pixel boundary 8 amounts to its largest value when the fiber pixel boundary 8 is at the sensor pixel center position 12. According to actual measurement, an error becomes noticeable when an average of the errors in the pixel values of two successive sensor pixels is equal to or larger than 94.8% of the largest error value. Thus, the threshold is preferably set to 94.8% (or a smaller value) of the largest error value. That is, it is preferable to determine that two successive sensor pixels belong to the large-error region 49 when an average error of the pixel values of the two successive sensor pixels is equal to or larger than 94.8% of the largest error value. The magnitude of an error is correlated with the distance of the fiber pixel boundary 8 in sensor pixels from the sensor pixel center position 12. The condition that an average error of two sensor pixels is equal to or larger than 94.8% of the largest error value corresponds to a condition that an average distance between the fiber pixel boundary 8 in two sensor pixels and the sensor pixel center position 12 is equal to or smaller than ⅕ times the sensor pixel pitch 10. For example, when the sensor pixel pitch 10 is $P_s$, a horizontal distance of the fiber pixel boundary 8 from the sensor pixel center position 12 is $\frac{1}{10} \times P_s$ for the pixel 43 in FIG. 3. Moreover, a horizontal distance of the fiber pixel boundary 8 from the sensor pixel center position 12 is $\frac{1}{10} \times P_s$ for the pixel in FIG. 3. Thus, since the average of the horizontal distances in the pixels 43 and 44, of the fiber pixel boundary 8 from the sensor pixel center position 12 is $\frac{1}{10} \times P_s$, the average distance is equal to or smaller than $\frac{1}{5} \times P_s$. In the pixel 45 two pixels away from the pixel 43 in FIG. 3, the horizontal distance of the fiber pixel boundary 8 from the sensor pixel center position 12 is $\frac{3}{10} \times P_s$. Thus, since the average of the horizontal distances in the pixels 43 and 45, of the fiber pixel boundary 8 from the sensor pixel center position 12 is $\frac{1}{5} \times P_s$, the average distance is not equal to or smaller than $\frac{1}{5} \times P_s$. That is, the pixels 43 and 44 belong to the large-error region 49 but the pixel 45 does not belong to the large-error region. In the example of FIG. 3, the large-error region 49 is made up of the two pixels 43 and 44.

When the size of the large-error region 49 increases, a moire pattern is easily noticeable. Conversely, if the size of the large-error region 49 is decreased, a large error is less noticeable when seen in a broad range. In particular, if the occurrence of the large-error region 49 is suppressed, a moire pattern can be made less noticeable since pixel values appear stably as a whole. That is, when regions having a large error are confined in one pixel so that the large-error region 49 does not occur, a moire pattern can be made noticeable as rarely as possible.

<Configuration of Sensor Pixel and Fiber Pixel in Present Embodiment>

Based on the above findings, the present embodiment employs a configuration in which the occurrence of a large-error region is suppressed. For this purpose, the configuration of the electronic image sensor 4 (sensor pixel) and the image fiber bundle 3 (fiber pixel) is modified. Hereinafter, the configuration of the electronic image sensor 4 and the image fiber bundle 3 according to the present embodiment will be described.

As described with reference to FIG. 1, the electronic image sensor 4 has a configuration in which a plurality of sensor pixels are arranged in a square lattice form. In the present embodiment, the sensor pixel pitch is 5.0 μm.

Figure 4A:
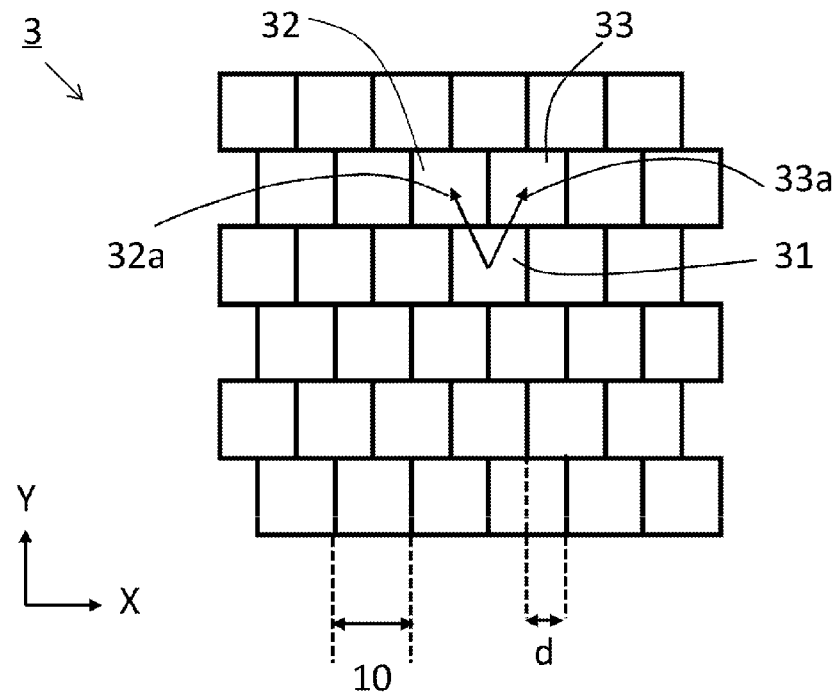
FIGS. 4A and 4B are diagrams for describing an arrangement of fiber pixels in Embodiment 1.

FIG. 4A illustrates an arrangement of the image fiber bundle 3. The image fiber bundle 3 has a two-dimensional arrangement of a plurality of fibers having a square cross-section. The fiber pixel pitch is 5.1 μm. The arrangement of the image fiber bundle 3 has a configuration in which pixel arrays of a plurality of image fibers arranged in a row in an X-direction (the horizontal direction of the electronic image sensor 4) are arranged in a Y-direction (the vertical direction of the electronic image sensor 4). In this case, two pixel arrays adjacent in the Y-direction are arranged so as to be shifted by a predetermined amount (indicated by d) in the X-direction. In the present embodiment, the shift amount d of the fiber pixels is set to ½ times (2.5 μm) the sensor pixel pitch 10. The image fiber bundle 3 has a configuration in which two rows of such pixel arrangements are repeatedly arranged in the Y-direction. The cross-section of the sensor pixel is not limited to the square shape but may have other shapes such as a circular shape or a polygonal shape.

Figure 4B:
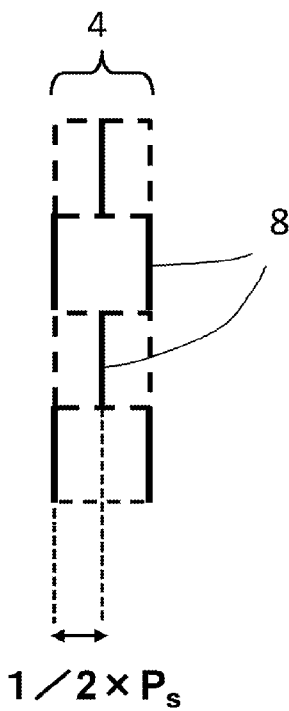

A state in which the occurrence of a large-error region is suppressed with the configuration of FIG. 4A will be described with reference to FIG. 4B. FIG. 4B illustrates a positional relation between the pixels of the electronic image sensor 4 arranged successively in the vertical direction (Y-direction) and the fiber pixel boundary 8. In two sensor pixels arranged successively in the vertical direction, the position of the fiber pixel boundary 8 is shifted in the horizontal direction by ½ times (=½×$P_s$) of the horizontal sensor pixel pitch ($P_s$). Thus, the average distance between the fiber pixel boundary 8 and the sensor pixel center position in the two sensor pixels arranged successively in the vertical direction is approximately ¼×$P_s$. This value is larger than the upper limit (⅙×$P_s$) of the above-described condition that the sensor pixels belong to the large-error region. Thus, according to the configuration of the present embodiment, any of the sensor pixels arranged successively in the vertical direction does not belong to the large-error region. That is, an image in which a moire pattern is less noticeable can be acquired.

Although FIG. 4A illustrates a configuration in which the fiber pixel boundary 8 matches the sensor pixel boundary, this configuration is not essential. Even when the fiber pixel boundary 8 does not match the sensor pixel boundary, the average distance between the fiber pixel boundary 8 and the sensor pixel center position in the two sensor pixels arranged successively in the vertical direction is approximately ¼×$P_s$. Thus, a large-error region does not occur and an image in which a moire pattern is less noticeable can be acquired.

Figure 5A:
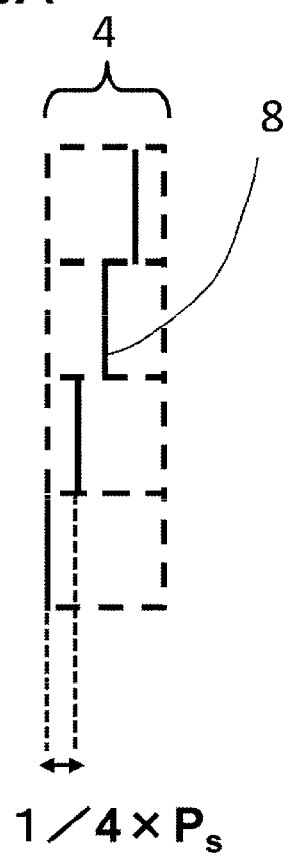
FIGS. 5A and 5B are diagrams for describing an arrangement of fiber pixels in Embodiment 1.

In the present embodiment, although a predetermined shift amount of the fiber pixel is set to ½×$P_s$, if the predetermined shift amount is between ¼×$P_s$ and ¾×$P_s$, the size of the large-error region can be reduced to one pixel or smaller. This will be described with reference to FIGS. 5A and 5B. FIG. 5A illustrates a positional relation between the pixels of the electronic image sensor 4 arranged successively in the vertical direction (Y-direction) and the fiber pixel boundary 8 when the predetermined shift amount is ¼ times the sensor pixel pitch. The average distance between the fiber pixel boundary 8 and the sensor pixel center position for two sensor pixels arranged successively in the vertical direction is minimized when the fiber pixel boundary 8 in either sensor pixel matches the sensor pixel center position. In this case, the average is ⅛×$P_s$. This value is larger than the upper limit (⅙×$P_s$) of the condition that the pixels belong to the large-error region. Thus, when the predetermined shift amount is ¼×$P_s$, the large-error region does not occur.

Moreover, when the predetermined shift amount is between ¼×$P_s$ and ½×$P_s$, the larger the predetermined shift amount, the larger the average distance between the fiber pixel boundary 8 and the sensor pixel center position for the two sensor pixels arranged successively in the vertical direction. Thus, the large-error region does not occur if the predetermined shift amount is between ¼×$P_s$ and ½×$P_s$.

Figure 5B:
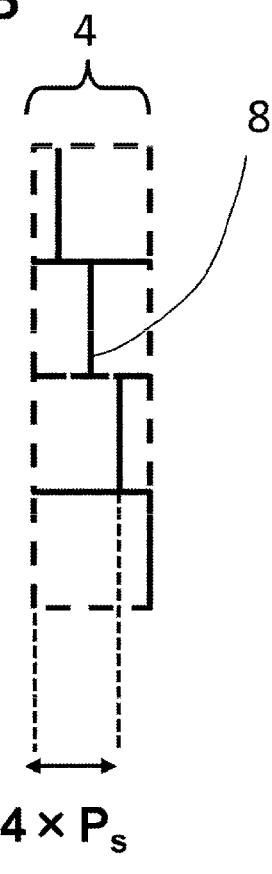

Moreover, when the predetermined shift amount d is larger than ½×$P_s$, substantially the same effect as when the predetermined shift amount d is −½×$P_s$ is obtained. FIG. 5B illustrates a case in which the predetermined shift amount is ¾×$P_s$. It can be understood that the case in which the predetermined shift amount is ¾×$P_s$ is substantially the same as the case in which the fiber pixel is shifted by ¼×$P_s$ in the negative X-direction. That is, when the predetermined shift amount is between ½×$P_s$ and ¾×$P_s$, the large-error region does not occur similarly to when the predetermined shift amount is between ¼×$P_s$ and ½×$P_s$.

As described above, when the predetermined shift amount is between ¼ times and ¾ times the sensor pixel pitch $P_s$, the large-error region does not occur. It can be understood from the above discussion that the large-error region does not occur even when the predetermined shift amount is between ⅖ times and ⅗ times the sensor pixel pitch $P_s$. Thus, the predetermined shift amount may be in the range of ⅖×$P_s$ and ⅗×$P_s$. However, the predetermined shift amount is preferably in the range of ¼ times and ¾ times the sensor pixel pitch $P_s$, and more preferably, in the range of ⅓ and ⅔ of the sensor pixel pitch $P_s$. Further preferably, the predetermined shift amount is ½×$P_s$. The predetermined shift amount is preferably as close as possible to ½×$P_s$.

Although the above description has been made assuming that a vertical stripe chart is used, the same can be applied by replacing the vertical direction and the horizontal direction with each other when a horizontal stripe chart is used.

Embodiment 2

In Embodiment 1, an example in which the sensor pixel pitch is 5.0 μm, the fiber pixel pitch is 5.1 μm, and these pitches are approximately the same has been described. In the present embodiment, a configuration in which the difference between the sensor pixel pitch and the fiber pixel pitch is larger will be described. In the present embodiment, the sensor pixel pitch is 5.0 μm and the fiber pixel pitch is 7.0 μm. The other configuration is the same at that of Embodiment 1, description thereof will not be provided.

Figure 6A:
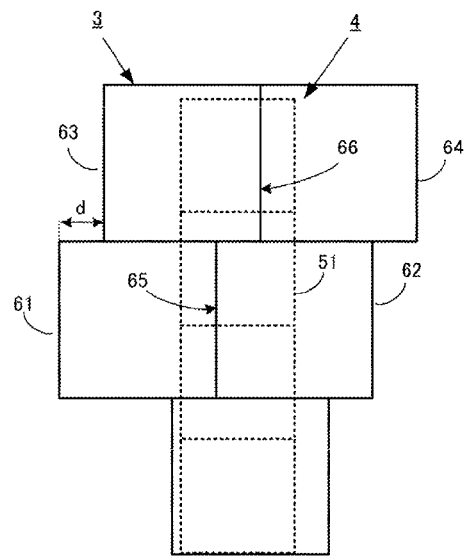
FIGS. 6A to 6D are diagrams for describing an arrangement of fiber pixels and sensor pixels in Embodiment 2.

FIG. 6A illustrates the configuration of the electronic image sensor 4 and the image fiber bundle 3 according to the present embodiment. In the present embodiment, the image fiber bundle 3 has the same configuration as Embodiment 1, in which pixel arrays arranged in the horizontal direction (X-direction) are arranged in the Y-direction while being shifted by a predetermined amount in the X-direction. In FIG. 6A, the predetermined shift amount is indicated by d.

As illustrated in FIG. 6A, a sensor pixel 51 of the electronic image sensor 4 overlaps four fiber pixels 61 to 64. Moreover, two vertical fiber pixel boundaries 65 and 66 are positioned inside the sensor pixel 51. The fiber pixel boundary 65 is the boundary between the fiber pixel 61 and the fiber pixel 62, and the fiber pixel boundary 66 is the boundary between the fiber pixel 63 and the fiber pixel 64.

Figure 6B:
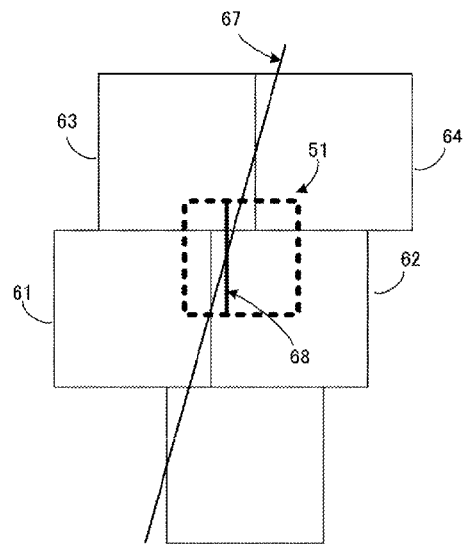
Figure 6C:
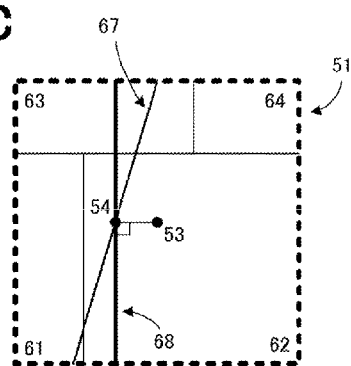

In this case, an error in the pixel value of the sensor pixel 51 when a vertical stripe rectangular chart is captured is different from that when one vertical fiber pixel boundary is positioned inside the sensor pixel 51. The error in the pixel value of the sensor pixel 51 is approximately the same as the error when one imaginary fiber pixel boundary 68 (hereinafter also referred to as a pseudo-fiber pixel boundary) is positioned in the sensor pixel 51 as illustrated in FIGS. 6B and 6C. The pseudo-fiber pixel boundary 68 is a vertical straight line determined based on a boundary line 67 between fiber pixels and the sensor pixel 51. More specifically, the pseudo-fiber pixel boundary 68 is determined as a straight line that is parallel to the vertical direction and passes through an intersection 54 between the boundary line 67 and a straight line that passes through a center point 53 of the sensor pixel 51 and is parallel to the horizontal direction. The fiber pixel boundary line 67 is a straight line that connects the mid-points of two pairs of fiber pixels (61-62 pair and 63-64 pair) adjacent in the horizontal direction.

Thus, in order for a large-error region to be received within one pixel, the following conditions need to be satisfied.
(Condition 1)

A horizontal position of a pseudo-fiber pixel boundary in two sensor pixels adjacent in the vertical direction is shifted by ¼ times or more and ¾ times or smaller than the sensor pixel pitch $P_s$.

Figure 6D:
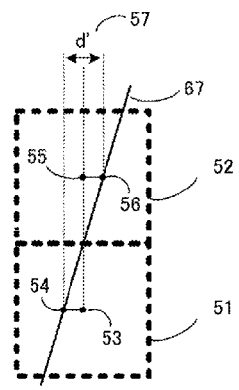

This will be described in more detail with reference to FIG. 6D. In FIG. 6D, the fiber pixel boundary line 67 passes through two sensor pixels 51 and adjacent in the vertical direction. An intersection between the boundary line 67 and a horizontal straight line that passes through the center point 53 of the sensor pixel 51 is denoted by 54, and an intersection between the boundary line 67 and a horizontal straight line that passes through the center point 55 of the sensor pixel 52 is denoted by 56. In this case, Condition 1 is the same as a condition that a horizontal distance 57 (d') between the intersections 54 and 56 is between ¼ times and ¾ times the sensor pixel pitch $P_s$.

As described in Embodiment 1, the range of the shift amounts of Condition 1 is preferably between ⅓ times and ⅔ times the sensor pixel pitch $P_s$, and more preferably, is as close as possible to ½ times.

The horizontal distance 57 (d'), the predetermined shift amount d of the fiber pixels, the fiber pixel pitch $P_f$, and the sensor pixel pitch $P_s$ are in a relation of $d'=d/P_f \times P_s$. Condition 1 can be expressed as follows.
(Condition 1')

A horizontal predetermined shift amount d of fiber pixels arranged in the vertical direction is between ¼ times and ¾ times the fiber pixel pitch $P_f$.

Next, the fiber pixel boundary line will be described in more detail. First, a boundary point between fiber pixels will be described with reference to FIGS. 7A to 7C.

Figure 7A:
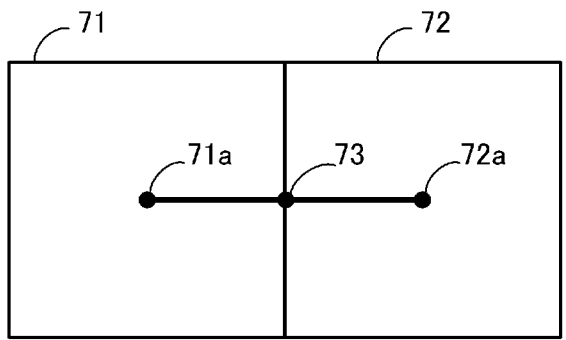
FIGS. 7A to 7C are diagrams for describing a boundary point between fiber pixels.

When fiber pixels 71 and 72 are in line-contact as in FIG. 7A, an intersection 73 between the contacting line and a straight line that connects a center point 71a of the fiber pixel 71 and a center point 72a of the fiber pixel 72 is defined as a boundary point. When the fiber pixel has a square shape, the mid-point of a segment that connects the center points 71a and 72a is the boundary point.

Figure 7B:
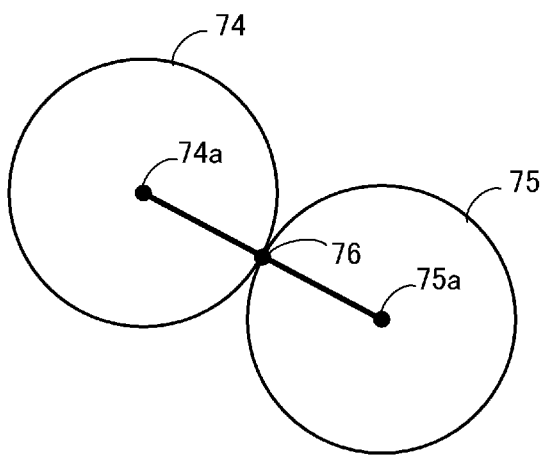

When fiber pixels 74 and 75 are in contact with each other at one point (contacting point 76) as in FIG. 7B, the contacting point 76 is defined as a boundary point. When a fiber pixel has a circular shape, the mid-point of a segment that connects a center point 74a of the fiber pixel 74 and a center point 75b of the fiber pixel 75 is the boundary point.

Figure 7C:
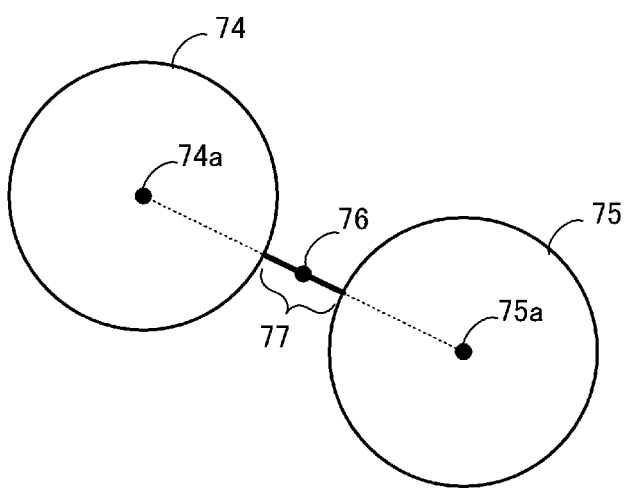

When fiber pixels 74 and 75 are not in contact as in FIG. 7C, a mid-point 76 of a segment 77 located in a region that does not belong to any of the fiber pixels, of a straight line that connects the center points 74a and 75a of the fiber pixels is defined as the boundary point of the fiber pixels 74 and 75.

A fiber pixel boundary line is a straight line that connects the boundary points of a plurality of fiber pixels. A plurality of straight lines that connects the boundary points of the fiber pixels may be present. Thus, the boundary line is defined as a straight line that is parallel to an arrangement direction of fiber pixels among the straight lines that connect the boundary points of the fiber pixels.

Figure 8A:
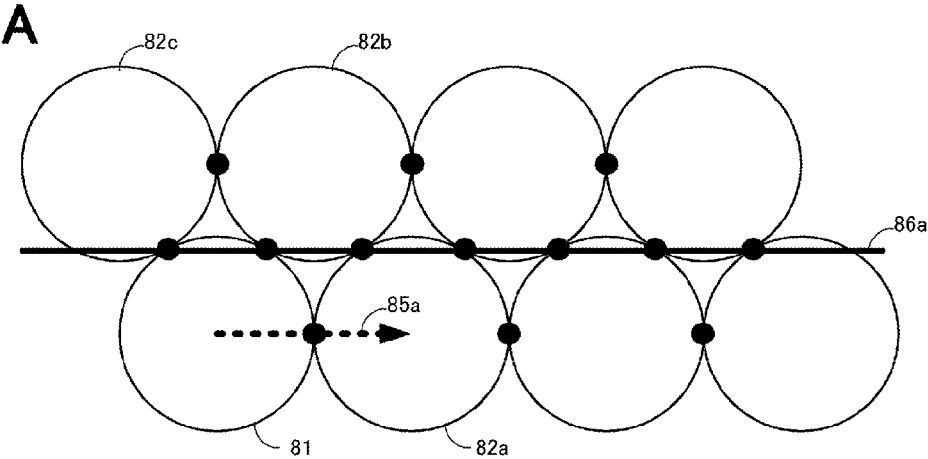
FIGS. 8A to 8C are diagrams for describing a boundary line between fiber pixels.
Figure 8B:
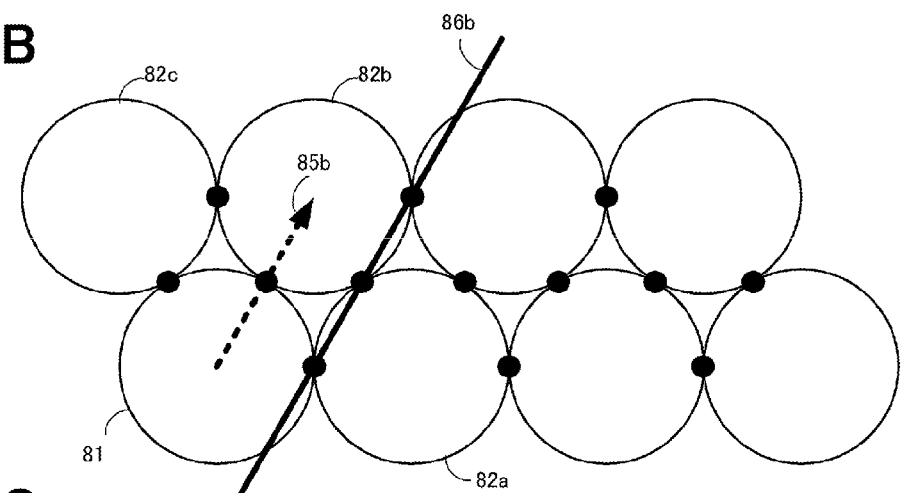
Figure 8C:
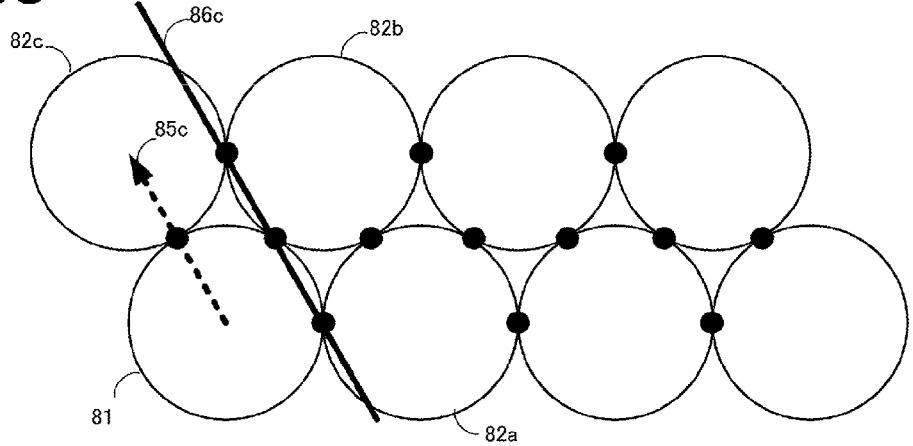

This will be described in more detail with reference to FIGS. 8A to 8C. FIGS. 8A to 8C illustrate the image fiber bundle 3 in which circular fiber pixels are arranged. In the drawings, boundary points of fiber pixels are depicted by black dots. An arrangement direction of fiber pixels is a direction of connecting centers of adjacent fiber pixels. Since a fiber pixel 81 is adjacent to fiber pixels 82a, 82b, and 82c, the fiber pixels have three arrangement directions 85a, 85b, and 85c. Although another three fiber pixels are adjacent to the fiber pixels 81, the arrangement directions obtained from these fiber pixels are the same as the arrangement directions 85a to 85c. The fiber pixel boundary line is a straight line that is parallel to the arrangement directions 85a to 85c among the straight lines that connect the boundary points of the fiber pixels. Thus, straight lines 86a, 86b, and 86c illustrated in FIGS. 8A to 8C are the fiber pixel boundary lines.

Since the fiber pixel boundary lines are defined as above, boundary lines in a plurality of directions are present in the image fiber bundle 3. For example, although FIG. 6B illustrates only one boundary line 67, three boundary lines 91 to 93 are present actually, as illustrated in FIG. 9. In this case, it is not necessary for all of these boundary lines to satisfy the above conditions. A boundary line of which the angle (acute angle) with respect to the horizontal direction (one of the arrangement directions of sensor pixels) is 45° or larger (90° or smaller) may satisfy the above conditions. This is because, for example, a fiber pixel boundary of which the angle with respect to the horizontal direction is 45° or larger has a large influence on the occurrence of a moire pattern resulting from a vertical stripe chart whereas a fiber pixel boundary of which the angle with respect to the horizontal direction is smaller than 45° has a small influence on the occurrence of a moire pattern. Therefore, it is possible to make a moire pattern resulting from a vertical stripe chart less noticeable if the above conditions are satisfied for a boundary line of which the angle with respect to the horizontal direction is 45° or larger.

A plurality of boundary lines of which the angle with respect to the horizontal direction is 45° or larger may be present. In this case, the effect of making a moire pattern less noticeable is obtained if at least one of the boundary lines satisfies the above conditions. However, it is preferable for all of the plurality of boundary lines to satisfy the above conditions. This is because the higher effect is obtained by doing so.

Condition 1 can be expressed as a condition for the horizontal distance 57 between the intersection 54 between the boundary line 67 and the horizontal straight line that passes through the center point 53 of the sensor pixel 51 and the intersection 56 between the boundary line 67 and the horizontal straight line that passes through the center point 54 of the sensor pixel 52 as described with reference to FIG. 6D. The horizontal distance 57 does not change even when the boundary line 67 is moved in parallel. For example, the horizontal distance is the same even when the boundary line 67 is replaced with a straight line that indicates the arrangement direction of the fiber pixels. Thus, Condition 1 can be expressed using a straight line that is parallel to the arrangement direction of the fiber pixels. Hereinafter, another expression of Condition 1 will be described.

Figure 10A:
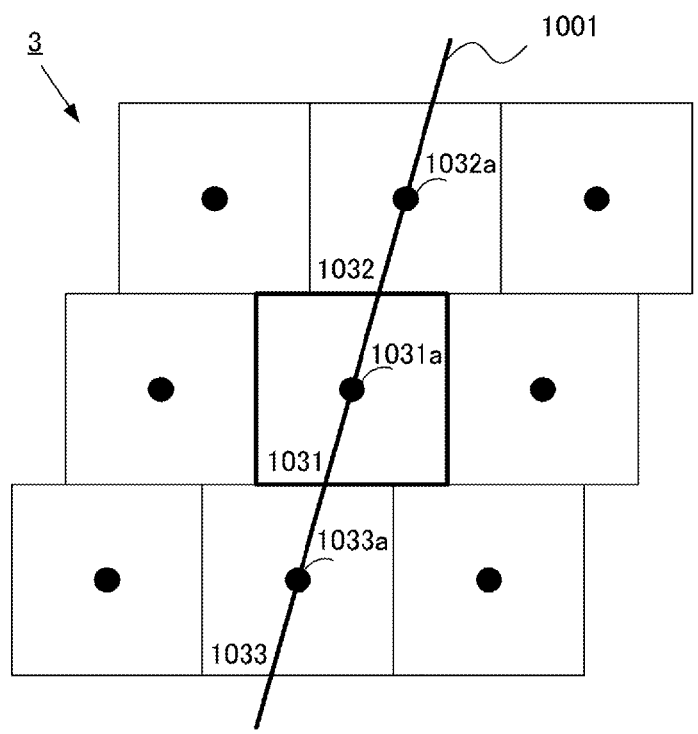
FIGS. 10A and 10B are diagrams for describing an arrangement of fiber pixels and sensor pixels in Embodiment 2.

First, an optional one of the fiber pixels is defined as a target pixel. Moreover, among fiber pixels adjacent to the target pixel, a fiber pixel in which an inclination of a straight line that connects the center of the fiber pixel and the center of the target pixel is between 45° and 135° with respect to the positive X-direction (first direction) is defined as an adjacent pixel. According to this definition, the straight line that connects the center of the target pixel and the center of the adjacent pixel is parallel to the arrangement direction of the fiber pixels and is thus parallel to the boundary line (57 in FIG. 6D) of the fiber pixels. For example, in FIG. 10A illustrating an arrangement of fiber pixels, a fiber pixel 1031 is defined as a target pixel. In this case, a fiber pixel 1032 corresponds to an adjacent pixel, and a straight line 1001 that connects the center 1031*a* of the fiber pixel 1031 and the center 1032*a* of a fiber pixel 1032 is parallel to the arrangement direction and the boundary line of the fiber pixels. Since the straight line 1001 also passes through the center 1033*a* of a fiber pixel 1033, the fiber pixel 1031 may be understood as an adjacent pixel.

Figure 10B:
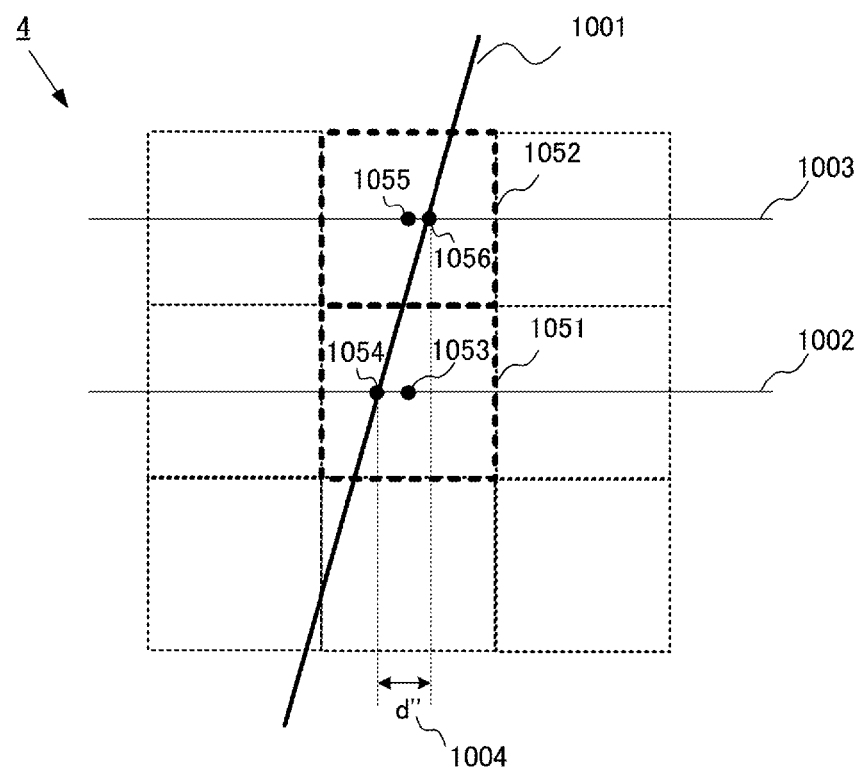

Moreover, optional two vertically adjacent sensor pixels that a straight line connecting the center of a target pixel and the center of an adjacent pixel crosses are defined as first and second sensor pixels. FIG. 10B illustrates a relation between an arrangement of sensor pixels and the straight line 1001. Here, since the straight line 1001 passes through sensor pixels 1051 and 1052 adjacent in the vertical direction, the sensor pixels 1051 and 1052 can be regarded as first and second sensor pixels, respectively. A point 1054 is an intersection between the straight line 1001 and a straight line 1002 that passes through the center 1053 of the sensor pixel 1051 and is parallel to the horizontal direction. A point 1056 is an intersection between the straight line 1001 and a straight line 1003 that passes through the center 1055 of the sensor pixel 1052 and is parallel to the horizontal direction. In this case, Condition 1 is the same as a condition that a horizontal distance 1004 (d″) between the intersections 1054 and 1056 is between ¼ times and ¾ times the sensor pixel pitch $P_s$.

In the above description, a configuration for making a moire pattern resulting from a vertical stripe less noticeable has been described. In order to make a moire pattern resulting from a horizontal stripe less noticeable, the horizontal and vertical directions may be replaced with each other in the above conditions.

Embodiment 3

An imaging apparatus according to a third embodiment will be described with reference to FIGS. 11A to 11C and FIGS. 12A and 12B.

Figure 11A:
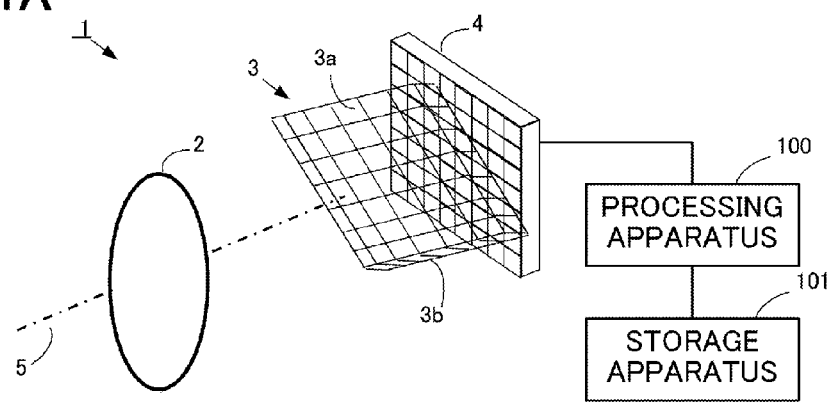
FIGS. 11A to 11C are diagrams illustrating a configuration of an imaging apparatus according to Embodiment 3.

FIG. 11A illustrates the configuration of a focusing optical system 2 and an electronic image sensor 4 according to the present embodiment. In Embodiment 3, the image fiber bundle 3 has a different configuration from Embodiments 1 and 2. The image fiber bundle 3 has a configuration in which square fiber pixels are arranged in a square lattice form. An arrangement direction of the image fiber bundle 3 is shifted by a predetermined angle with respect to an arrangement direction of the electronic image sensor 4. That is, it can be understood that the image fiber bundle 3 is rotated by a predetermined angle in a plane perpendicular to the optical axis 5 as compared to an arrangement in which an arrangement direction thereof is aligned with respect to the arrangement direction of the electronic image sensor 4. The other configuration and operation are the same as those of Embodiments 1 and 2, and redundant description thereof will not be provided.

Figure 11B:
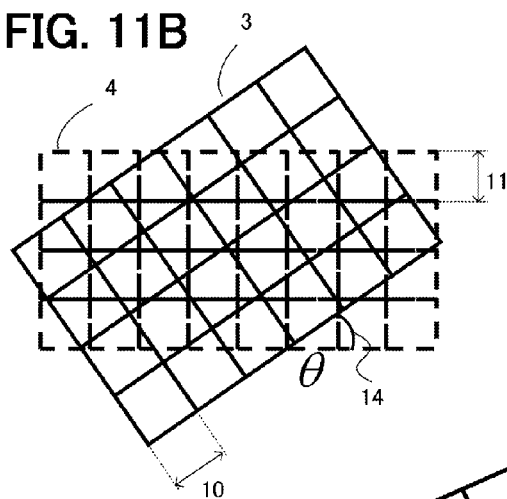

FIG. 11B is a view of the image fiber bundle 3 and the electronic image sensor 4 when seen from the focusing optical system 2. A fiber pixel pitch 11 is set to 6.0 μm, a sensor pixel pitch 10 is set to 5.0 μm, and a rotation angle 14 of the image fiber bundle 3 is set to θ=24.6°.

In the image fiber bundle 3 having such a configuration, if the conditions described in Embodiment 2 are satisfied, an effect that a large-error region does not occur and a moire pattern is less noticeable can be obtained. The configuration of the image fiber bundle 3 and the electronic image sensor 4 of the present embodiment satisfy the above conditions, which will be described below.

Figure 11C:
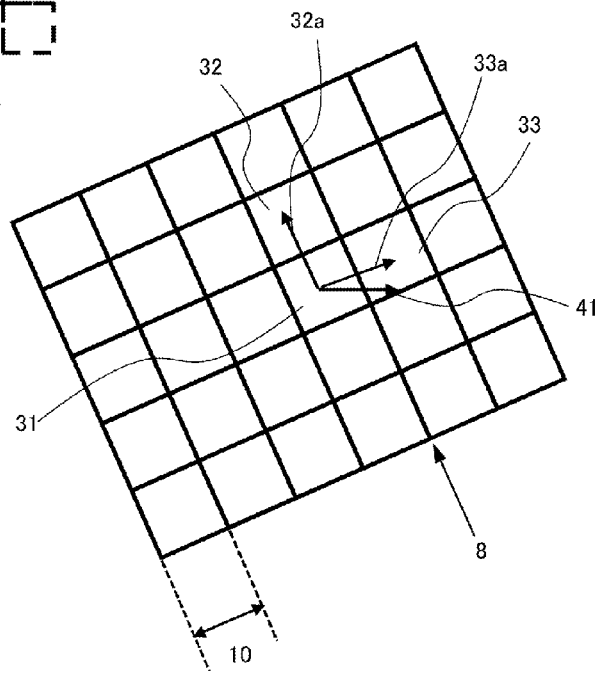

FIG. 11C illustrates an arrangement of the image fiber bundle 3 according to the present embodiment. In the present embodiment, the image fiber bundle 3 has two arrangement directions of first and second arrangement directions 32*a* and 33*a*. In this example, since a vertical stripe rectangular chart is captured, an arrangement direction in which the angle with respect to the horizontal direction 41 is between 45° and 135° is important. The first arrangement direction 32*a* has an inclination of 90°+θ (=114.6°) with respect to the first direction, which is between 45° and 135°. In contrast, the second arrangement direction 33*a* has an inclination of θ (=24.6°) with respect to the first direction, which is smaller than 45°. Thus, it is necessary for a fiber pixel boundary line that is parallel to the first arrangement direction 32*a* to satisfy the conditions described in Embodiment 2.

Figure 12A:
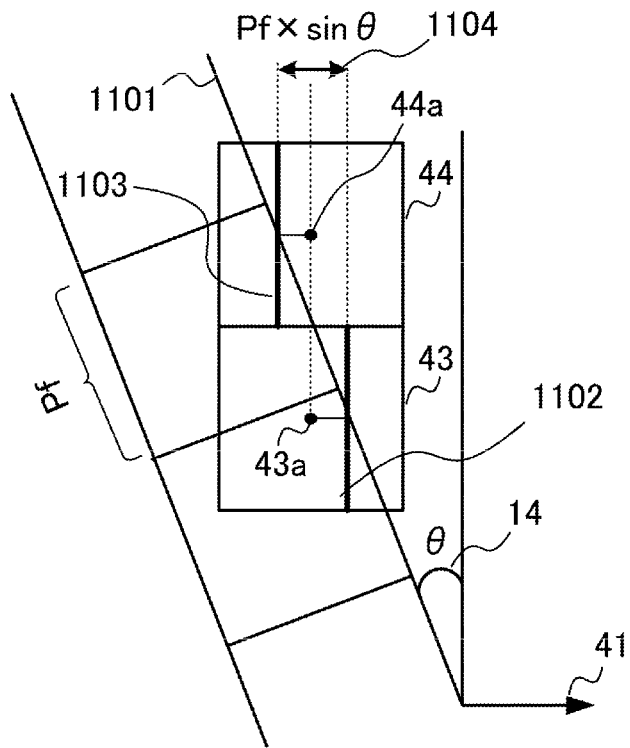
FIGS. 12A and 12B are diagrams for describing an arrangement of fiber pixels and sensor pixels in Embodiment 3.

FIG. 12A illustrates a positional relation between a fiber pixel boundary line 1101 parallel to the first arrangement direction 32*a* and pixels of the electronic image sensor 4. The fiber pixel boundary line 1101 overlaps sensor pixels 43 and 44 arranged successively in the vertical direction. In this case, an error of the pixel value of the sensor pixel 43 can be regarded as being the same as that when a vertical fiber pixel boundary 1102 that passes through an intersection between the boundary line 1101 and a straight line that passes through the center point 43*a* of the sensor pixel 43 and is parallel to the horizontal direction 41 is present. Similarly, an error of the pixel value of the sensor pixel 44 can be regarded as being the same as that when a vertical fiber pixel boundary 1103 that passes through an intersection between the boundary line 1101 and a straight line that passes through the center point 44*a* of the sensor pixel 44 and is parallel to the horizontal direction 41 is present. Thus, if a condition that a horizontal distance 1104 between the imaginary fiber pixel boundaries 1102 and 1103 is between ¼ times and ¾ times the sensor pixel pitch is satisfied, a large-error region does not occur in a captured image. The distance 1104 can be expressed by $P_f \times \sin\theta$ using the fiber pixel pitch $P_f$. Thus, if the condition of the following inequality is satisfied, a large-error region is not produced and a moire pattern occurring due to a difference between the pixel cycle of the electronic image sensor 4 and the pixel cycle of the image fiber bundle 3 is less noticeable.

$$\tfrac{1}{4} \times P_s \leq P_f \times \sin\theta \leq \tfrac{3}{4} \times P_s \qquad \text{(Condition 2)}$$

In the present embodiment, $P_f$=6.0 μm, $P_s$=5.0 μm, and θ=24.6°. Thus, $P_f \times \sin\theta = 2.50 = \tfrac{1}{2} \times P_s$ and Condition 2 is satisfied. That is, according to the configuration of the present embodiment, the effect of making a moire pattern less noticeable is obtained. Although the effect of the present invention is obtained when Condition 2 is satisfied, it is preferable that $\tfrac{1}{3} \times P_s \leq P_f \times \sin\theta \leq \tfrac{2}{3} \times P_s$, and more preferably, $P_f \times \sin\theta = \tfrac{1}{2} \times P_s$. The configuration of the present embodiment satisfies this condition and is thus preferable.

Moreover, even when the value θ is shifted approximately by 10° from 24.6° due to reasons such as manufacturing errors, $P_f \times \sin\theta$ falls within the range of $0.30 \times P_s$ and $0.68 \times P_s$. Thus, since Condition 2 is satisfied even when such a degree of manufacturing errors occurs, the effect of making a moire pattern less noticeable is maintained. That is, the configuration of the present embodiment is advantageous for manufacturing.

Hereinabove, it has been described that the configuration of the present embodiment provides the effect of making a moire pattern less noticeable when a vertical stripe rectangular chart is captured.

The configuration of the present embodiment also provides the effect of making a moire pattern less noticeable even when a horizontal stripe rectangular chart is captured as well as the vertical stripe rectangular chart, which will be described below. When a horizontal stripe rectangular chart is captured, the vertical direction of the electronic image sensor 4 needs to be regarded as a reference direction. As illustrated in FIG. 11C, an angle between the first arrangement direction 32a and the vertical direction is θ (=24.6°) and is smaller than 45°. An angle between the second arrangement direction 33a and the vertical direction is 90°−θ (=65.4°) and is larger than 45°. Therefore, it is necessary for the fiber pixel boundary line parallel to the second arrangement direction 33a to satisfy the condition described in Embodiment 2.

Figure 12B:
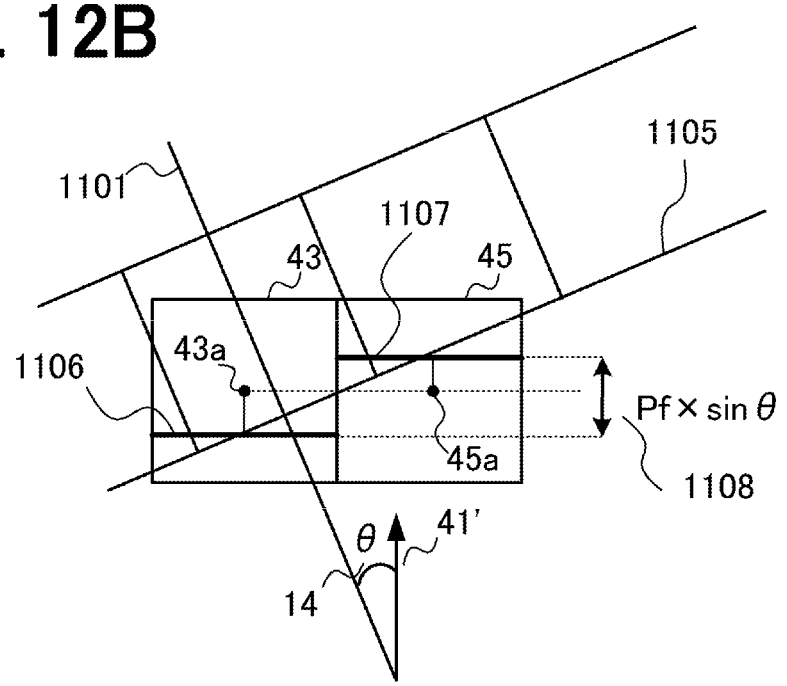

FIG. 12B illustrates a positional relation between a fiber pixel boundary line 1105 parallel to the second arrangement direction 33a and pixels of the electronic image sensor 4. The fiber pixel boundary line 1105 overlaps sensor pixels 43 and 45 arranged successively in the horizontal direction. In this case, an error of the pixel value of the sensor pixel 43 can be regarded as being the same as that when a horizontal fiber pixel boundary 1106 that passes through an intersection between the boundary line 1105 and a straight line that passes through the center point 43a of the sensor pixel 43 and is parallel to a vertical direction 41' is present. Similarly, an error of the pixel value of the sensor pixel 45 can be regarded as being the same as that when a horizontal fiber pixel boundary 1107 that passes through an intersection between the boundary line 1105 and a straight line that passes through the center point 45a of the sensor pixel 45 and is parallel to the vertical direction 41' is present. Thus, if a condition that a vertical distance 1108 between the imaginary fiber pixel boundaries 1106 and 1107 is between ¼ times and ¾ times the sensor pixel pitch is satisfied, a large-error region does not occur in a captured image. The distance 1108 can be expressed by $P_f \times \sin\theta$ using the fiber pixel pitch $P_f$. That is, the distance 1108 is the same as the distance 1104 in FIG. 12A. Thus, when Condition 2 is satisfied, the effect of making a moire pattern less noticeable when a horizontal stripe chart is captured as well as a vertical stripe chart is obtained.

As described above, in the imaging apparatus 1 according to the present embodiment, a moire pattern which occurs due to a difference between the pixel cycle of the electronic image sensor 4 and the pixel cycle of the image fiber bundle 3 can be made less noticeable in either the horizontal or vertical direction of the electronic image sensor 4.

Although the image fiber bundle 3 of the present embodiment has a configuration in which square fiber pixels are arranged in a square lattice form, the configuration of the image fiber bundle 3 is not limited to this. For example, the fiber pixels may have other shapes such as a circular shape or a polygonal shape other than the square shape. Moreover, the arrangement of the fiber pixels is not limited to the square lattice form but may have a hexagonal lattice form or a rhombic lattice form. In the above description, the angle θ has been described as a rotation angle of the image fiber bundle 3 for the sake of convenience. However, when the arrangement of the fiber pixels has another form other than the square lattice form, the rotation angle is to be understood as the angle between the arrangement direction of the fiber pixels and the horizontal direction (or the vertical direction).

Embodiment 4

Embodiment 4 is different from Embodiment 3 in that the rotation angle 14 of the image fiber bundle 3 is θ=12.0°. The other configuration and operation are the same as those of Embodiment 3, and redundant description thereof will not be provided. In this case, since $P_f \times \sin\theta = 0.25 \times P_s$, Condition 2 is satisfied. Thus, similarly to Embodiment 3, the effect of making a moire pattern less noticeable is obtained.

Moreover, since the rotation angle 14 is θ=12.0° and is close to θ=0°, a state close to the state in which the arrangement direction of the image fiber bundle 3 is aligned with respect to the arrangement direction of the electronic image sensor 4 is created. Thus, it is advantageous in that artifacts rarely occur.

Embodiment 5

Embodiment 5 is different from Embodiment 3 in that the rotation angle 14 of the image fiber bundle 3 is θ=38.7°. The other configuration and operation are the same as those of Embodiment 3, and redundant description thereof will not be provided. In this case, since $P_f \times \sin\theta = 0.75 \times P_s$, Condition 2 is satisfied. Thus, similarly to Embodiment 3, the effect of making a moire pattern less noticeable is obtained.

Moreover, since the rotation angle 14 is θ=38.7° and is close to θ=45°, it is possible to provide an advantage that the captured image appears approximately the same in both horizontal and vertical directions of the electronic image sensor 4.

Other Embodiments

The present invention can be used in products which use an imaging apparatus, such as a digital camera, a digital video camera, a mobile phone camera, a surveillance camera, a medical camera, a wearable camera, an infrared camera, or an X-ray camera. Moreover, the present invention can be used in a projecting apparatus such as a projector or a head-mounted display (HMD).

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-127250, filed on Jun. 20, 2014, which is hereby incorporated by reference herein in its entirety.

What is claimed is:

1. An imaging apparatus comprising:
an image sensor in which a plurality of sensor pixels are arranged in a first direction and a second direction perpendicular to the first direction; and
an image fiber which has an exit end surface facing the image sensor and guides light incident from a focusing optical system toward the image sensor and in which a plurality of fiber pixels are periodically arranged two-dimensionally, wherein
when an optional pixel among the fiber pixels is defined as a target pixel, and
when a fiber pixel which is adjacent to the target pixel and in which an inclination of a straight line that connects the center of the fiber pixel and the center of the target pixel is between 45° and 135° with respect to the first direction is defined as an adjacent pixel, and moreover
when any one of sensor pixels that a straight line passing through the center of the target pixel and the center of the adjacent pixel crosses is defined as a first sensor pixel, and either one of two sensor pixels that are adjacent to the first sensor pixel in the second direction is defined as a second sensor pixel,
a distance in the first direction between an intersection between a straight line that passes through the center of the first sensor pixel and is parallel to the first direction and a straight line that connects the center of the target pixel and the center of the adjacent pixel and an intersection between a straight line that passes through the center of the second sensor pixel and is parallel to the first direction and the straight line that connects the center of the target pixel and the center of the adjacent pixel is between ¼ times and ¾ times a pixel pitch of the image sensor.

2. The imaging apparatus according to claim 1, wherein the distance is between ⅓ times and ⅔ times the pixel pitch of the image sensor.

3. The imaging apparatus according to claim 1, wherein the image fiber has a configuration in which pixel arrays in which the plurality of fiber pixels are arranged in the first direction are arranged in the second direction while being shifted by a predetermined amount in the first direction.

4. The imaging apparatus according to claim 3, wherein a pixel pitch of the image fiber is between 0.8 times and 1.2 times the pixel pitch of the image sensor, and
the predetermined amount is between ¼ times and ¾ times the pixel pitch of the image sensor.

5. The imaging apparatus according to claim 3, wherein the predetermined amount is between ¼ times and ¾ times a pixel pitch of the image fiber.

6. An imaging apparatus comprising:
an image sensor in which a plurality of sensor pixels are arranged in a first direction and a second direction perpendicular to the first direction; and
an image fiber which has an exit end surface facing the image sensor and guides light incident from a focusing optical system toward the image sensor and in which a plurality of fiber pixels are periodically arranged two-dimensionally, wherein
when an optional pixel among the fiber pixels is defined as a target pixel, and
when a fiber pixel which is adjacent to the target pixel and in which an inclination of a straight line that connects the center of the fiber pixel and the center of the target pixel is between 45° and 135° with respect to the first direction is defined as an adjacent pixel, and
when an angle between a straight line, which connects the center of the target pixel and the center of the adjacent pixel and the first direction, is defined as $\theta$, and
when a pixel pitch in the first direction of the image sensor is defined as $P_s$, and moreover
when a pixel pitch of the image fiber along the straight line that connects the center of the target pixel and the center of the adjacent pixel is defined as $P_f$,
the following inequality is satisfied:

$$\tfrac{1}{4} \times P_s \leq P_f \times \sin\theta \leq \tfrac{3}{4} \times P_s.$$

7. The imaging apparatus according to claim 6, wherein the following inequality is further satisfied:

$$\tfrac{1}{3} \times P_s \leq P_f \times \sin\theta \leq \tfrac{2}{3} \times P_s.$$

8. The imaging apparatus according to claim 6, wherein the image fiber has a configuration in which the fiber pixels are arranged in a square lattice form or a hexagonal lattice form.

* * * * *